(12) United States Patent
Muneyuki et al.

(10) Patent No.: US 6,403,920 B1
(45) Date of Patent: Jun. 11, 2002

(54) LASER PROCESSING APPARATUS AND METHOD

(75) Inventors: Ken Muneyuki, Kadoma; Kenji Kasai; Izuru Nakai, both of Toyonaka; Haruhiro Yuki, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/495,856

(22) Filed: Feb. 1, 2000

(30) Foreign Application Priority Data

Feb. 9, 1999 (JP) .............................. 11-030877

(51) Int. Cl.[7] .............................................. B23K 13/00
(52) U.S. Cl. .................................................. 219/121.77
(58) Field of Search .......................... 219/121.7, 121.76, 219/121.77, 121.67, 121.68, 121.69

(56) References Cited

U.S. PATENT DOCUMENTS 4,734,550 A * 3/1988 Imamura et al. ....... 219/121.77
5,478,983 A * 12/1995 Rancourt ............... 219/121.63
6,064,637 A * 5/2000 Ju et al. .................. 369/44.23

FOREIGN PATENT DOCUMENTS

| EP | 04 76965 | 3/1992 |
| EP | 08 57536 | 8/1998 |
| EP | 08 84128 | 12/1998 |

* cited by examiner

*Primary Examiner*—Samuel M. Heinrich
(74) *Attorney, Agent, or Firm*—Jordan and Hamburg LLP

(57) ABSTRACT

In a laser processing apparatus, laser beams are respectively focused and irradiated by focusing devices onto a work being processed, thereby performing laser processing in processing areas B within predetermined ranges on the work. An adjustment member is provided for automatically adjusting an interval C between the center points of the focusing devices in correspondence with the size of an entire processing area A on the work being processed.

2 Claims, 4 Drawing Sheets

LASER PROCESSING APPARATUS AND METHOD

FIELD OF THE INVENTION

The present invention relates to a laser processing apparatus and method for using laser beams in laser machining processes such as processes for opening holes in a work being processed such as an electronic circuit board.

BACKGROUND OF THE INVENTION

One example of a laser processing apparatus of this type that is known is configured so that, as diagrammed in FIG. 4, minute holes are perforated in work being processed such as a board 7 by laser beam irradiation. With this laser processing apparatus, a laser beam 2 is output from a laser oscillator 1, reflected by a reflecting mirror 3a to change its direction, and then branched into two directions by a beam splitting device 9. The branched laser beams 2a and 2b are guided, respectively, by reflecting mirrors 3b and 3c and by reflecting mirrors 3d to 3f toward galvanometers 4 and 5 equipped with galvano-mirrors with axes in the P and Q dimensions, after which the laser beams 2a and 2b have their directions of irradiation changed by the sweep of the galvanometers 4 and 5, are input to fθ lenses 6a and 6b, respectively, and focused. Then the laser beams 2a and 2b are irradiated and scanned in the X and Y directions in a processing area B within predetermined ranges on the board 7 that is positioned by an XY table 8. The XY table is then moved, and the next processing areas are laser-processed.

In laser processing methods that use the laser processing apparatus described above, however, when processing is performed to open holes in the board 7 by the laser beams 2c focussed by the fθ lenses 6a and 6b, due to the necessity of realizing roundness in the holes, the processing areas B are limited to approximately 50 mm or so in the X and Y dimensions, respectively, by the effective diameters of the fθ lenses 6a and 6b. The dimensions of the board 7 are such that the sides measure 200 to 500 mm or so, which is roughly the same over the entire processing area A. Accordingly, if the dimensions of the board 7 are 500 mm in the X dimension and 350 mm in the Y dimension, for example, a matrix of 70 processing areas B is necessary in order to process the entire processing area A.

The dimensions of the board 7 are various, however, and, if the interval between the two fθ lenses 6a and 6b is constant, there will be cases where even though processing with one fθ lens is finished the processing with the other fθ lens will not be finished. In such cases it is necessary to continue processing with the other fθ lens for a considerable time, to the detriment of processing efficiency. It is also necessary to implement measures so that the one fθ lens laser beam is not being irradiated onto the board 7 while processing is in progress with the other fθ lens, and energy is lost during that time due to the wasted laser irradiation.

SUMMARY OF THE INVENTION

Thereupon, an object of the present invention is to provide a laser processing apparatus and method that resolves such problems as those described in the foregoing, wherewith changes in the dimensions of the work being processed can be coped with, and laser processing can be performed efficiently and with high productivity.

In order to achieve the object stated above, the present invention provides a laser processing apparatus comprising: a laser oscillator for outputting laser beams; a beam splitting device for branching the laser beam output from the laser oscillator into a plurality of laser beams; a plurality of scanning devices for guiding the branched laser beams to processing positions on a work being processed; a plurality of focusing devices for focusing and irradiating the branched laser beams onto said work being processed, thereby performing laser processing with the branched laser beams in a processing area within predetermined ranges on said work being processed; an XY table for carrying thereon the work being processed and for moving said work relative to said plurality of focusing devices; and an adjustment member for automatically adjusting interval between center points of said plurality of focusing devices in correspondence with size of entire processing area on said work being processed.

As based on the present invention, when the board or other work being processed is moved relative to the focusing devices and the processing areas are sequentially processed, the points in time when the laser processing in all of the focusing devices is finished are made to coincide by automatically adjusting the interval between the center points of the focusing devices in correspondence with the size of the entire processing area of the work being processed. Hence it is possible to eliminate the wasted work time and wasted laser irradiation resulting from the non-coincidence of laser process finishing times that has been a problem in the prior art, and to perform laser processing efficiently and with high productivity.

In the invention described in the foregoing, it is preferable if a light path length adjustment member is also provided for adjusting the light path lengths so that the light path lengths from the point where the light beam is branched by the beam splitting device to the processing points where the light beams are focused by the focusing devices after passing through the scanning devices are made the same length. By providing light path length adjustment member, the non-coincidence in light path length arising in conjunction with adjusting the interval between the center points of the focusing devices can be corrected, and the focused state of the laser beams can be maintained the same, wherefore simultaneous processing can be performed precisely on the work being processed.

In order to achieve the object stated above, the present invention provides a laser processing method wherein: a laser processing apparatus is employed wherein: a laser beam output from a laser oscillator is branched into two beams by branching means; the branched laser beams are respectively guided by scanning means to process positions on work being processed and focused and irradiated by focusing means onto the work being processed, thereby performing laser processing with the two laser beams on processing areas within predetermined ranges on the work being processed; the work being processed is moved relative to the two focusing means; and the next processing areas are sequentially laser-processed by the laser beams irradiated from the focusing means; and laser processing is performed, automatically adjusting the interval between the center points of the focusing means in correspondence with the size of the entire processing area on the work being processed so that that interval is always ½ the length of the entire processing area.

As based on the present invention, using two laser beams, the interval between the center points of the two focusing devices can be automatically adjusted, and laser processing can be performed efficiently and with high productivity.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

A first embodiment of the present invention is described below with reference to FIG. 1 and FIG. 2.

Figure 1:
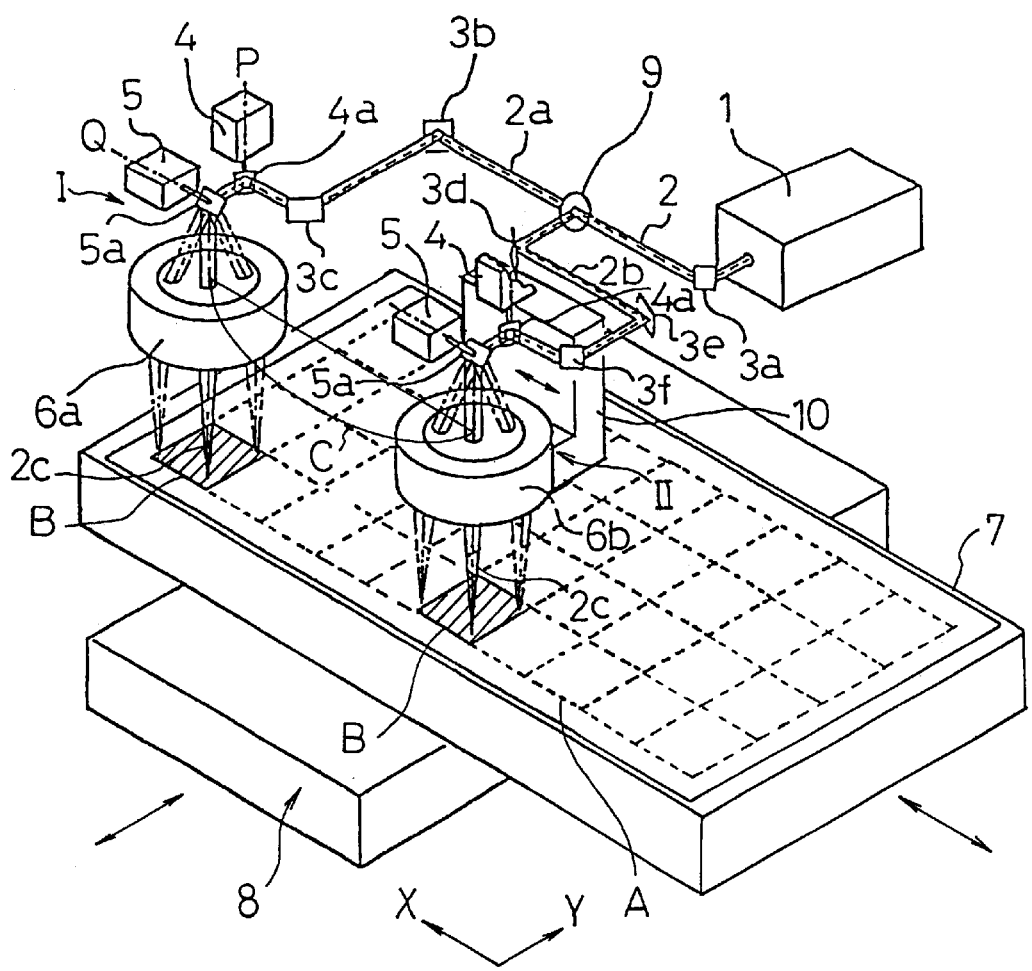
FIG. 1 is a perspective view representing the configuration of a laser processing apparatus used in a laser processing method in a first embodiment of the present invention.
Figure 2:
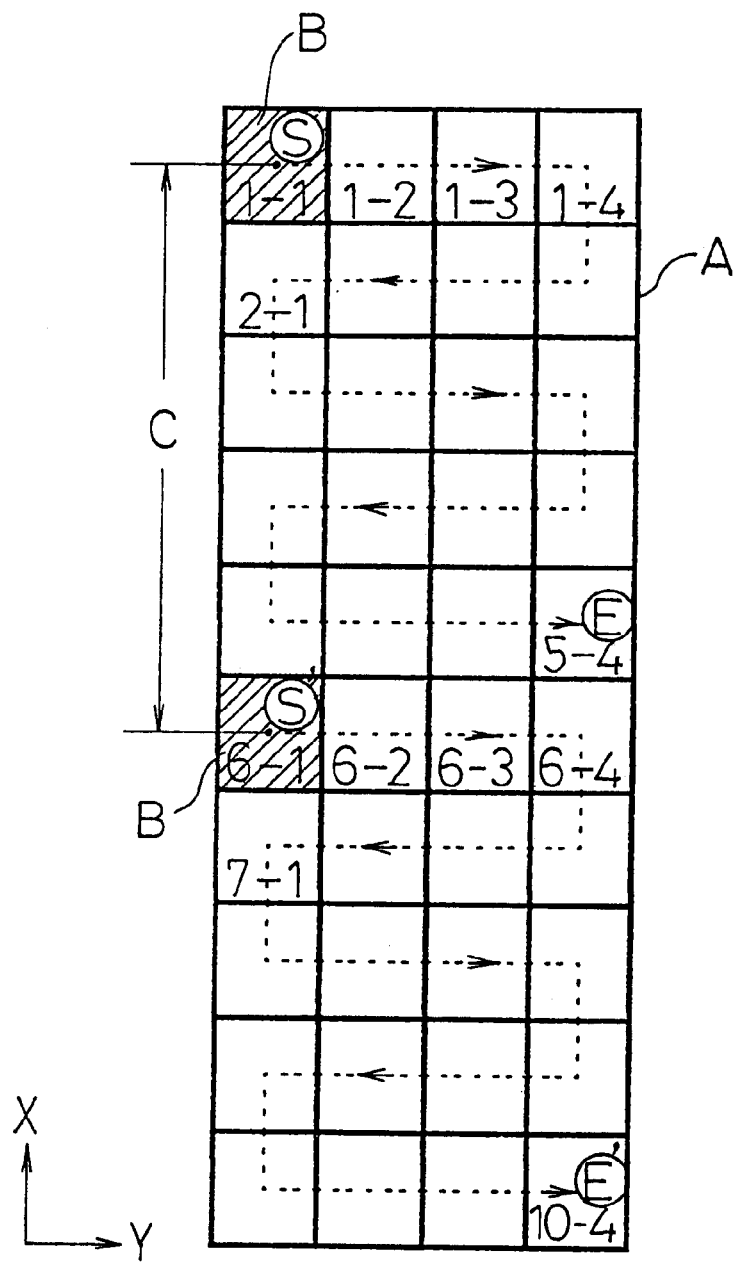
FIG. 2 is a simplified diagram for describing the movement when the entire processing area is being laser-processed in the first embodiment.

FIG. 1 shows the configuration of a laser processing apparatus used in the laser processing method according to the first embodiment of the present invention. A laser beam 2 output from a laser oscillator 1 has its direction changed by a reflecting mirror 3a and is then branched into two laser beams 2a and 2b by a beam splitting device 9. The branched laser beams 2a and 2b, respectively, are guided by reflecting mirrors 3b and 3c and reflecting mirrors 3d to 3f and are input to fθ lenses (focusing devices) 6a and 6b from galvano-mirrors 4a and 5a provided in galvanometers (scanning devices) 4 and 5 which make the laser beams 2a and 2b scan in the X and Y axes. After being focused by the fθ lenses 6a and 6b, the laser beams 2a and 2b are directed to a processing area B within predetermined ranges on a board (work being processed) 7 that is positioned by an XY table 8, and hole opening processing is performed.

The laser irradiation units configured by the galvanometers 4 and 5 and the fθ lenses 6a and 6b are divided into two sets. The laser irradiation unit I comprising the fθ lens 6a is made stationary, while the laser irradiation unit II comprising the fθ lens 6b can be adjustably moved for the purpose of positioning.

To the laser irradiation unit II is attached a table (adjustment member) 10. The fθ lens 6b can be moved to the optimal processing position by automatically adjusting the interval C between the center points of the fθ lenses 6a and 6b in correspondence with the dimensions (entire processing area A) of the board 7. Accordingly, the points in time where laser processing is finished in the two fθ lenses 6a and 6b can be made to coincide, and the wasted work time and wasted laser irradiation caused by non-coincidence of laser process finishing times can be eliminated.

The laser processing method of the first embodiment is described next.

First, the table 10 is moved and positioned so that an interval C between the center points in an X dimension of the fθ lenses 6a and 6b becomes ½ of the total length in the X dimension of an entire processing area A on the board 7.

If, for example, the length in the X dimension of the entire processing area A on the board 7 is assumed to be 500 mm, then the interval C between the center points in the X dimension of the fθ lenses 6a and 6b is set to $C=500$ mm$/2=250$ mm.

Next, the board 7 is positioned to the predetermined position by the XY table 8, and the laser beam 2c is guided to the processing position on the board 7 by the galvano-mirrors 4a and 5a comprised in the galvanometers 4 and 5. The laser beam 2 is focused and directed by the fθ lenses 6a and 6b, and hole opening processing can be done sequentially, in each of the predetermined ranges of the respective processing areas B on the board 7 by the laser irradiating units I and II.

The hole opening process using the laser beam 2c described above is described in detail with reference to FIG. 2.

In this embodiment, the entire processing area A is divided into processing areas B in a 4×10 40-element matrix. By automatically adjusting the interval C between the center points of the fθ lenses 6a and 6b of the laser irradiating units I and II, respectively, as indicated by the broken-line arrows in FIG. 2, with the laser irradiating unit I, processing is performed sequentially, starting from 1-1 (point S), moving to 1-2, 1-3, 1-4, 2-4, 2-3, etc., and terminating at 5-4 (point E). With the other laser irradiating unit II, processing is performed, starting from 6-1 (point S'), moving to 6-2, 6-3, 6-4, 7-4, 7-3, etc., and terminating at 10-4 (point E').

By automatically adjusting the interval C between the center points of the fθ lenses 6a and 6b so that it is ½ the overall length of the entire processing area A in the X dimension, as described in the foregoing, any timing wherewith processing cannot be done by either one of the laser irradiating units I or II is eliminated, and processing data are not wasted, wherefore laser processing can be performed efficiently and with high productivity.

Figure 3:
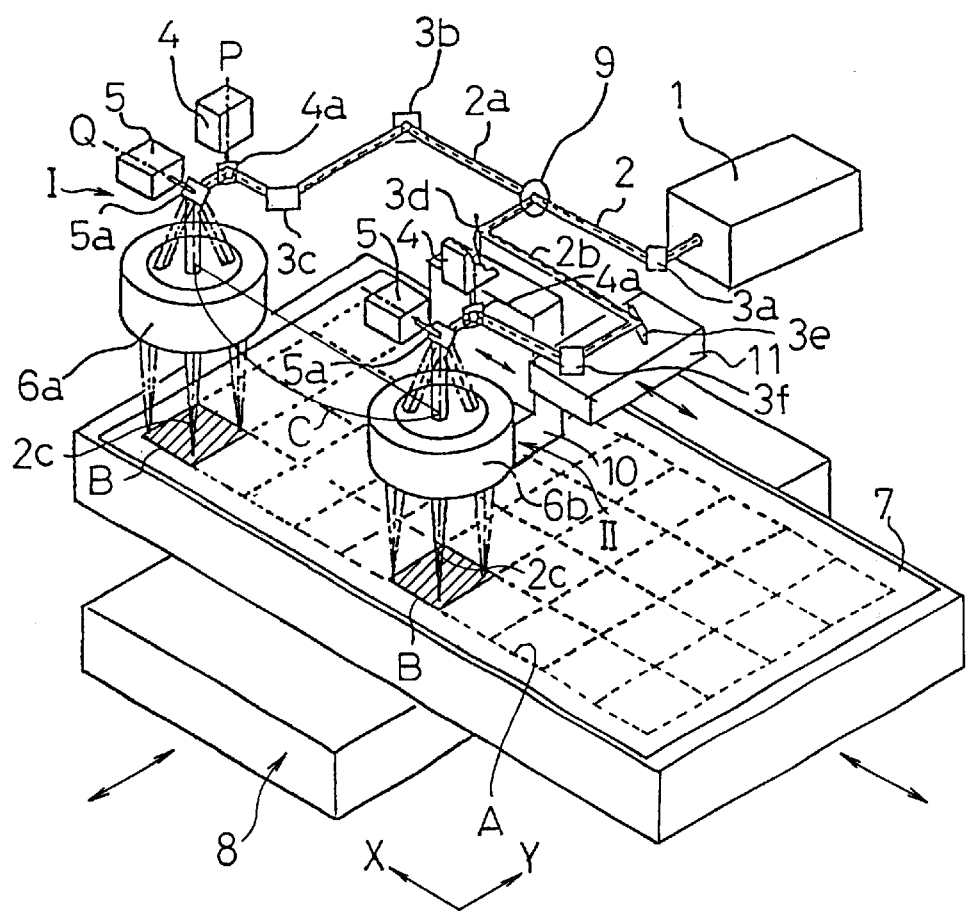
FIG. 3 is a perspective view representing the configuration of a laser processing apparatus used in a laser processing method in a second embodiment of the present invention.
Figure 4:
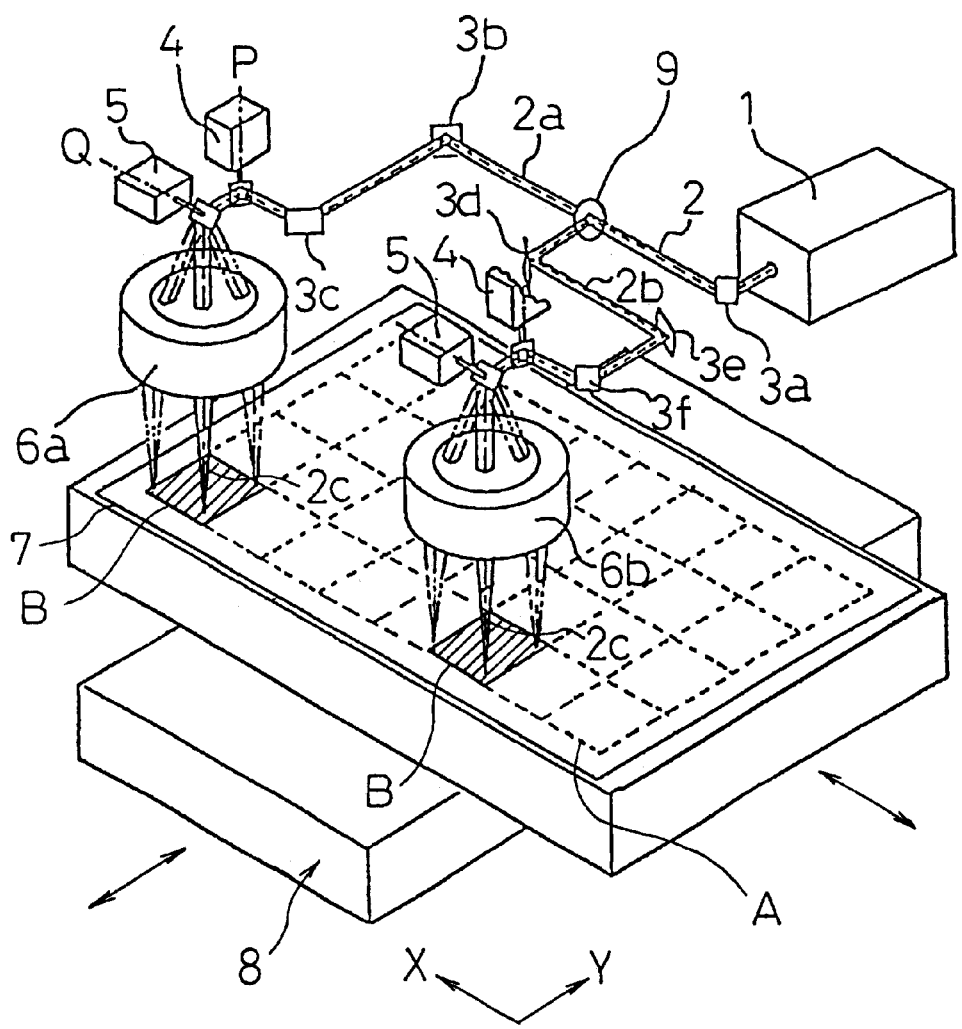
FIG. 4 is a perspective view representing the configuration of a laser processing apparatus used in a conventional laser processing method.

FIG. 3 shows the configuration of a laser processing apparatus used in a laser processing method according to a second embodiment of the present invention. In the first embodiment, there are cases where, in conjunction with adjusting the interval C between the center points by moving the table 10, the light path length of the laser beam 2b of the laser irradiating unit II will be different than the light path length of the laser beam 2a of the laser irradiating unit I. In order to correct this, the configuration is made such in the second embodiment that, by moving a table (light path length adjustment member) 11 on which the reflecting mirrors 3e and 3f are carried, the light path length of the laser beam 2b can be automatically adjusted.

In FIG. 3, as in the first embodiment, the laser beam 2 output from the laser oscillator 1 is branched into two beams by the beam splitter 9 and guided to two sets of laser irradiating units, I and II, which comprise galvanometers 4 and 5 and fθ lenses 6a and 6b. The lengths of the light paths for the double-branched laser beams 2a and 2b from the point of branching until they arrive at the focus points (processing points) on the board 7 formed by the fθ lenses 6a and 6b of the laser irradiating units I and II are varied by the relative motion of the laser irradiating unit II. With this embodiment aspect, however, it becomes possible to adjust those light path lengths by moving a table 11 that carries the reflecting mirrors 3e and 3f.

In other words, the laser irradiating unit II can be positioned by adjustably moving the table 11 so that the light path length resulting when the laser beam 2a is branched by the beam splitter 9 and directed toward the laser irradiating unit I, is reflected by the reflecting mirrors 3b and 3c and input to the galvano-mirror 4a, and the light path lengths resulting when the laser beam 2b is branched by the beam splitter 9 passes through the reflecting mirror 3d and is then reflected by the reflecting mirrors 3e and 3f carried on the table 11 and input to the galvano-mirror 4a, become identical distances. When, for example, the pitch of the laser irradiating units I and II is moved by exactly the distance D, the amount of movement in the table 11 becomes D/2 (not shown).

Thus, by causing the light path distances from the branching point of the laser beam 2 branched by the beam splitter 9 to the focus points at the laser irradiating units I and II to coincide, the focused state of the branched laser beams 2a and 2b can be kept identical. As a result, laser processing can be performed precisely on the board 7.

According to the present invention, as described in the foregoing, the interval between focusing means is automatically adjusted in correspondence with the size of the entire processing area on the board or other work being processed, wherefore wasted process time can be eliminated, and such laser processing as hole opening processing can be performed efficiently, precisely, and with high productivity.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A laser processing method comprising:

dividing a rectangle-shaped entire processing area on a work being processed into a plurality of processing areas;

positioning two focusing devices such that an interval between center points of the two focusing devices is ½ of a length of a side of the entire processing area;

positioning the work being processed relative to the two focusing devices;

branching a laser bean into two laser beams;

focusing the two laser beams respectively by the two focusing devices;

irradiating the two focused laser beams to respective processing areas, thereby performing laser processing in the processing areas on the work being processed; and moving the work being processed relative to the focusing devices, such that a straight line connecting the center points of the two focusing devices is kept parallel with the side of the entire processing area, to sequentially laser-process an untreated processing area adjacent to the treated processing area with the laser beams irradiated from the two focusing devices.

2. The laser processing method according to claim 1, further comprising: adjusting lengths of light paths of the two laser beams, from the point where the laser beam is branched into the two laser beams to focus points where the two laser beams are focused, such that the lengths of the light paths of the two laser beams are identical.

* * * * *